(12) United States Patent
Eguchi

(10) Patent No.: US 7,763,146 B2
(45) Date of Patent: Jul. 27, 2010

(54) DISASSEMBLY METHOD AND REUSE METHOD OF SUBSTRATE MOUNTING MEMBER

(75) Inventor: Masahito Eguchi, Chita-Gun (JP)

(73) Assignee: NGK Insulators, Ltd., Nagoya (JP)

( * ) Notice: Subject to any disclaimer, the term of this patent is extended or adjusted under 35 U.S.C. 154(b) by 890 days.

(21) Appl. No.: 11/554,099

(22) Filed: Oct. 30, 2006

(65) Prior Publication Data

US 2007/0103844 A1    May 10, 2007

(30) Foreign Application Priority Data

Nov. 7, 2005    (JP)    ............... 2005-322193

(51) Int. Cl.
*H01T 23/00*    (2006.01)
(52) U.S. Cl. ............... 156/344; 156/306.3; 156/159; 156/326; 156/382
(58) Field of Classification Search .............. 156/159, 156/344, 326, 306.3, 282, 292
See application file for complete search history.

(56) References Cited

U.S. PATENT DOCUMENTS

| | | | | |
|---|---|---|---|---|
| 2,956,904 | A | * | 10/1960 | Hendricks ............... 428/345 |
| 5,423,931 | A | * | 6/1995 | Inoue et al. ............... 156/94 |
| 6,211,499 | B1 | * | 4/2001 | Morrow et al. ............ 219/678 |
| 2003/0121601 | A1 | * | 7/2003 | Tajima ................. 156/254 |
| 2004/0040665 | A1 | * | 3/2004 | Mizuno et al. ......... 156/345.51 |
| 2005/0276934 | A1 | * | 12/2005 | Fukui et al. ............. 428/32.6 |
| 2007/0029043 | A1 | * | 2/2007 | Henley ................. 156/344 |
| 2007/0134536 | A1 | * | 6/2007 | Takase et al. ............ 429/35 |
| 2007/0151088 | A1 | | 7/2007 | Suzuki et al. |

FOREIGN PATENT DOCUMENTS

| | | |
|---|---|---|
| JP | 2004-055815 A1 | 2/2004 |
| JP | 2005-251728 A1 | 9/2005 |

\* cited by examiner

*Primary Examiner*—Khanh Nguyen
*Assistant Examiner*—Keith T Aziz
(74) *Attorney, Agent, or Firm*—Burr & Brown

(57) ABSTRACT

An electrostatic chuck and a base member are separated from each other while heating up a substrate mounting member to a thermal decomposition temperature within a range from a thermal decomposition starting temperature to a thermal decomposition ending temperature and then softening and decomposing an organic adhesive layer.

5 Claims, 4 Drawing Sheets

DISASSEMBLY METHOD AND REUSE METHOD OF SUBSTRATE MOUNTING MEMBER

CROSS REFERENCE TO RELATED APPLICATIONS

This application is based upon and claims the benefit of priority from Japanese Patent Application No. 2005-322193, filed on Nov. 7, 2005; the entire contents of which are incorporated herein by reference.

BACKGROUND OF THE INVENTION

1. Field of the Invention

The present invention relates to a disassembly method and reuse method of a substrate mounting member. More specifically, the present invention relates to a method for separating an electrostatic chuck and a base member, which construct the substrate mounting member, from each other. Moreover, the present invention relates to a method for reusing at least any one of the separated electrostatic chuck and base member. The substrate mounting member performs treatments such as dry etching and deposition for a substrate such as a wafer.

2. Description of the Related Art

In a manufacturing process of a semiconductor device and the like, in order to perform a treatment in a high-vacuum atmosphere, such as plasma etching, a technology for holding a semiconductor wafer by using an electrostatic chuck constructing a substrate mounting member is used.

This substrate mounting member is formed by bonding a base member and the electrostatic chuck to each other through an organic adhesive layer. Moreover, when the substrate mounting member is used for a long period of time, the organic adhesive layer is deteriorated, and thermal conductivity and the like between the base member and the electrostatic chuck are reduced. Hence, heretofore, the substrate mounting member has been scrapped after having been used for a predetermined time.

However, since the substrate mounting member is expensive, a technology for separating the base member and the electrostatic chuck from each other and reusing both of them has been developed in recent years. This is a method for separating the base member and the electrostatic chuck from each other by dissolving and removing the organic adhesive layer deteriorated by the long-term use by means of an organic solvent (for example, refer to Japanese Patent Laid-Open Publication No. 2004-55815).

SUMMARY OF THE INVENTION

However, in such a disassembly method using the organic solvent in the above-described related art, there has been a problem that, since the organic solvent is difficult to permeate into the organic adhesive layer, it takes an extremely long time to dissolve the organic adhesive layer.

Moreover, there is also conceived a method for dissolving a part of the organic adhesive layer by using the organic solvent, and then chipping off a residual portion of the organic adhesive layer by using a wire saw and the like. However, in this method, there is an apprehension that the base member formed of an aluminum alloy or the like may be scratched, and accordingly, this method has not been preferable.

In this connection, it is an object of the present invention to provide a disassembly method of the substrate mounting member, which separates the base member and the electrostatic chuck in a short time without scratching the base member and the like, and to provide a reuse method of the substrate mounting member, which bonds the separated base member and electrostatic chuck to each other one more time.

In order to achieve the above-described object, a disassembly method of a substrate mounting member according to the present invention is a disassembly method of a substrate mounting member, including: heating up a substrate mounting member formed by bonding an electrostatic chuck and a base member to each other through an organic adhesive layer to a thermal decomposition temperature within a range from a thermal decomposition temperature to thermal decomposition ending temperature of the organic adhesive layer, and softening and decomposing the organic adhesive layer; and applying a separation load to the electrostatic chuck and the base member in a direction of pulling the electrostatic chuck and the base member apart from each other, thereby separating the electrostatic chuck and the base member from each other.

Moreover, a reuse method of a substrate mounting member according to the present invention is a reuse method, wherein the electrostatic chuck and the base member are separated from each other by using the above-described disassembly method, and then at least either the separated electrostatic chuck or the separated base member is reused.

According to the disassembly method of a substrate mounting member according to the present invention, the electrostatic chuck and the base member can be separated from each other in an extremely short time without scratching the base member and the like.

Specifically, in the conventional method for immersing the substrate mounting member in the organic solvent, it has been extremely difficult to separate the electrostatic chuck and the base member from each other even if the substrate mounting member is immersed into the organic solvent over a day and a night. However, according to the present invention, the organic adhesive layer can be peeled off in an extremely short time. Moreover, according to the present invention, characteristics and dimensions of the electrostatic chuck and the base member are not deteriorated, and accordingly, the separated electrostatic chuck and base member can be reused as they are.

Moreover, according to the reuse method of a substrate mounting member according to the present invention, the expensive substrate mounting member is not scrapped, and accordingly, cost can be reduced, and in addition, a quantity of waste can be reduced.

DETAILED DESCRIPTION OF THE INVENTION

A description will be made of embodiments of the present invention.

First Embodiment

First, a description will be made of a first embodiment according to the present invention.

Figure 1:
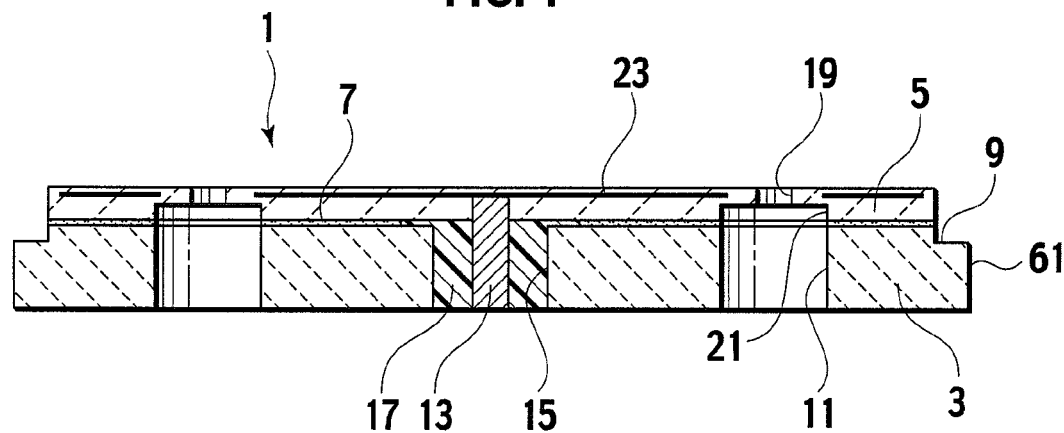
FIG. 1 is a cross-sectional view showing a substrate mounting member according to an embodiment of the present invention.

As shown in FIG. 1, a substrate mounting member 1 according to this embodiment includes a base member 3 made of aluminum, an aluminum alloy, or the like, an electrostatic chuck 5 which holds a semiconductor wafer, and an organic adhesive layer 7 which bonds the base member 3 and the electrostatic chuck 5 to each other. Specifically, the substrate mounting member 1 is a member formed by bonding the base member 3 and the electrostatic chuck 5 to each other through the organic adhesive layer 7.

The base member 3 has a disc-like outer shape, in which a step difference portion 9 is formed on an upper end portion of an outer circumferential surface 61. Moreover, a plurality of housing holes 11 which house a support plate (not shown) for lift pins therein are formed at an equal interval along a circumferential direction so as to penetrate the base member 3 in a plate thickness direction. Furthermore, in a diametrical center of the base member 3, an attachment hole 15 for a voltage applying terminal 13 is drilled. Epoxy resin 17 having insulating property is filled in an inner circumferential side of the attachment hole 15, and maintains insulation between the voltage applying terminal 13 and the base member 3.

Moreover, the electrostatic chuck 5 also has a disc-like outer shape, and is made of aluminum nitride or alumina. At positions of the electrostatic chuck 5, which correspond to the housing holes 11 of the base member 3, lift pin holes 19 are drilled. Spot facing portions 21 are formed on lower portions of the lift pin holes 19, and lift pins (not shown) are provided so as to communicate therethrough with the housing holes 11 of the base member 3. A construction is adopted so that tip ends of the lift pins coupled to the support plate (not shown) for lift pins can protrude/retract from/to the lift pin holes 19. Moreover, a disc-like electrode 23 is embedded in an inside of the electrostatic chuck 5, and the disc-like electrode 23 is bonded to the voltage applying terminal 13.

Note that, for the organic adhesive layer 7 which bonds the base member 3 and the electrostatic chuck 5 to each other, it is preferable to use thermosetting acrylic resin, thermosetting silicon resin, thermosetting polyimide resin, thermosetting epoxy resin, thermosetting acrylic resin, thermoplastic acrylic resin, or the like. This organic adhesive layer 7 can be formed by coating a viscous adhesive on the base member 3 or the electrostatic chuck 5. Moreover, such an organic adhesive as described above is formed into a sheet shape in advance, and is sandwiched between the base member 3 and the electrostatic chuck 5 to adhere both of them, thus making it possible to form the organic adhesive layer 7.

Moreover, a description will be made of a heating apparatus which heats up the substrate mounting member 1.

Figure 2:
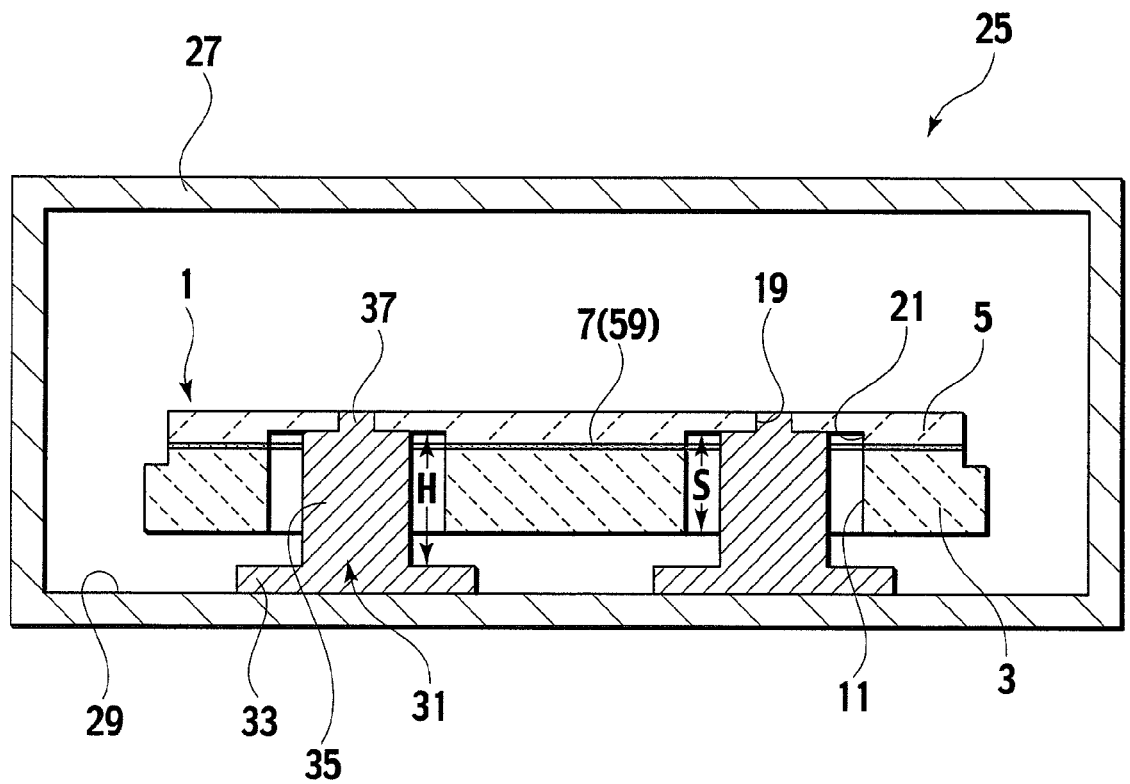
FIG. 2 is a cross-sectional view showing a state of separating a base member from the substrate mounting member in a heating apparatus.

As shown in FIG. 2, a heating apparatus 25 includes a box-shaped heating furnace 27 shielded from the outside air, and support bodies 31 arranged on a bottom surface 29 of the heating furnace 27 and extended upward. Each support body 31 is composed of a flange-like bottom portion 33, a columnar body portion 35 extended upward from the bottom portion 33, and a protruding portion 37 formed on an upper end of the body portion 35. The bottom portion 33 is formed into a wide-area flange shape so that the support body 31 cannot fall sideways, and is fixed to the bottom surface 29 of the heating furnace 27. Moreover, a diameter of the body portion 35 is set smaller than that of each housing hole 11 of the base member 3. A height H from an upper surface of the bottom portion 33 to an upper surface of the body portion 31 is set larger than a total dimension S of a thickness of the base member 3 and a depth of each spot facing portion 21 of the electrostatic chuck 5. It is preferable that a difference between the height H and the total dimension S be 5 mm or less. Moreover, inert gas such as nitrogen gas is filled in the heating furnace 27, and an inner temperature of the heating furnace 27 is maintained at a thermal decomposition temperature (for example, 300° C.) of the organic adhesive layer 7.

Figure 3:
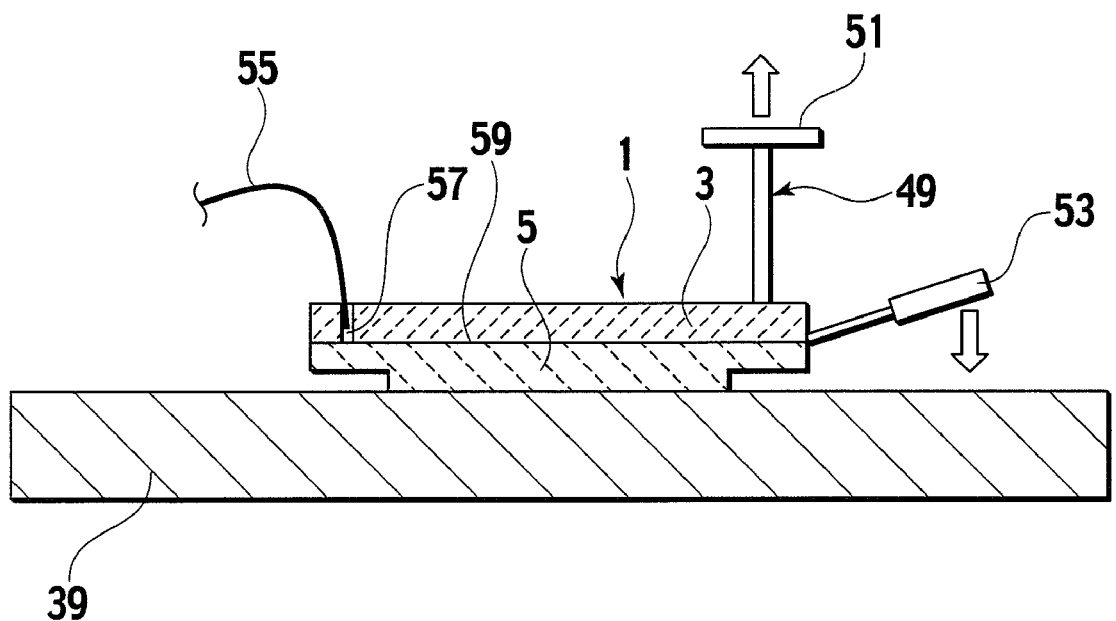
FIG. 3 is a side view showing a state of mounting the substrate mounting member on a hot plate and separating the base member therefrom.

Moreover, as shown in FIG. 3, a hot plate 39 can be used as the heating apparatus. In the case of using the hot plate 39, the substrate mounting member 1 is heated up while being exposed to the outside air.

The hot plate 39 is connected to a power supply (not shown). The substrate mounting member 1 is directly mounted on an upper surface of the heated hot plate 39, thus making it possible to heat up the substrate mounting member 1.

Figure 4:
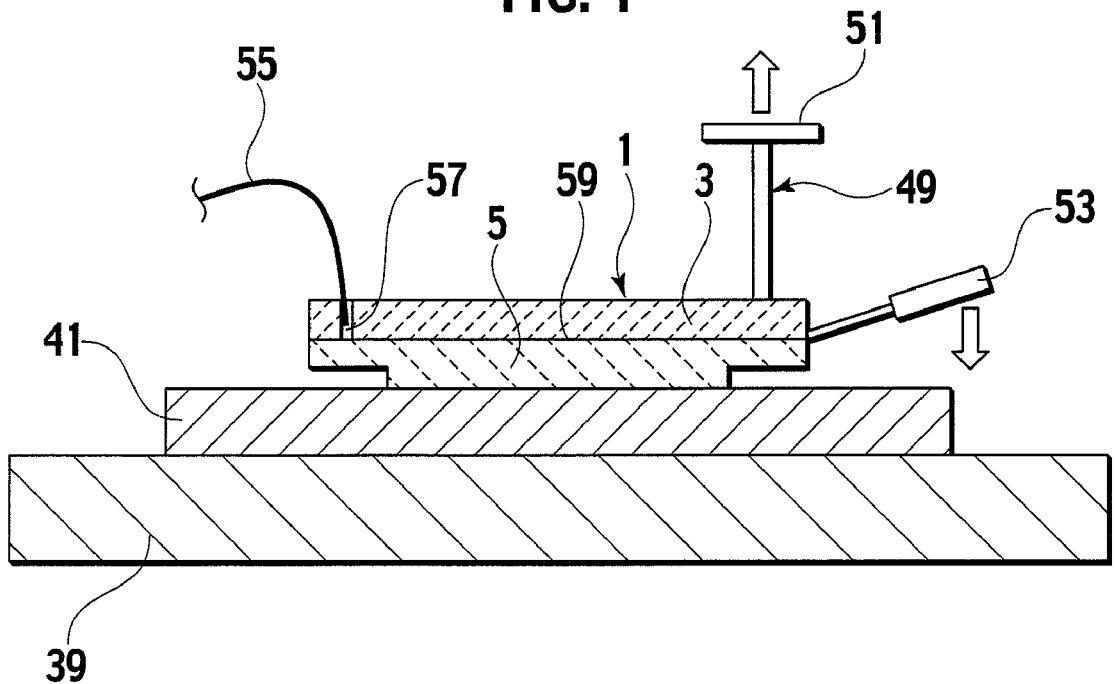
FIG. 4 is a cross-sectional view showing a state of mounting the substrate mounting member on a heat transfer member located on the hot plate and separating the base member therefrom.

Moreover, as shown in FIG. 4, an apparatus in which a heat transfer member 41 is mounted on the upper surface of the hot plate 39 may also be used as the heating apparatus. It is preferable that the heat transfer member 41 be formed of a ceramic material made of, for example, aluminum nitride. A description will be made below of a disassembly method of the substrate mounting member for each step.

(1) Measurement Step of Thermal Decomposition Temperature of Organic Adhesive Layer First, for a bonding material such as a resin-made bonding sheet which forms the organic adhesive layer 7, the thermal decomposition temperature at which the bonding material causes thermal decomposition is measured. Specifically, in the case of heating up the bonding material to raise a temperature of the bonding material, a ratio of a weight of the entire bonding material and a weight of the bonding material which is lost owing to the thermal decomposition is measured. For example, when the weight of the entire bonding material before being heated is set at 500 mg, and the bonding material is heated up at a heating rate of 5° C./min, a temperature at which such a lost weight owing to the thermal decomposition becomes 10% (50 mg) is set as a thermal decomposition starting temperature. Moreover, a temperature at which the lost weight owing to the thermal decomposition becomes 50% (250 mg) with respect to the weight before the bonding material is heated up is set as a thermal decomposition ending temperature. Subsequently, a temperature between the thermal decomposition starting temperature and the thermal decomposition ending temperature is set as the thermal decomposition temperature. Note that such a lost weight ratio owing to the thermal decomposition can be set appropriately in response to a type of the organic adhesive layer 7. Moreover, the thermal decomposition starting temperature and the thermal decomposition ending temperature may also be assumed and obtained from data described in a product catalog and the like of the bonding material without actually measuring the lost weights owing to the thermal decomposition.

(2) Separation Step of Electrostatic Chuck and Base Member

Subsequently, the electrostatic chuck 5 and the base member 3 are separated from each other while being heated up. With regard to a method for separating the electrostatic chuck 5 and the base member 3 from each other, there can be employed a case of using a self weight of the base member 3, a case of attaching weight pieces onto the base member 3 and using a total load of the base member 3 and the weight pieces, a case of using a tool such as a minus screwdriver, and the like.

First, a description will be made of a heating method of the substrate mounting member 1. In this heating method, there are a method for disposing the substrate mounting member 1 in the heating furnace 27 and heating up the substrate mounting member 1, a method for mounting the substrate mounting member 1 on the upper surface of the hot plate 39 and heating up the substrate mounting member 1, and a method for providing the heat transfer member 41 on the upper surface of the hot plate 39, mounting the substrate mounting member 1 on the upper surface of the heat transfer member 41, and heating up the substrate mounting member 1.

A description will be made of the case of using the self weight of the base member 3. As shown in FIG. 2, the heating apparatus 25 is used, which is composed of the box-shaped heating furnace 27, and the support bodies 31 arranged in the heating furnace 27.

The nitrogen gas as the inert gas is filled in the heating furnace 27, and the inner temperature of the heating furnace 27 is raised to such a heating temperature as described above. In this state, the substrate mounting member 1 is housed in the heating furnace 27, and is then heated up. Specifically, the base member 3 in the substrate mounting member 1 is faced downward, the lift pin holes 19 of the electrostatic chuck 5 are fitted to the protruding portions 37 of the support bodies 31, and the electrostatic chuck 5 is suspended on the support bodies 31.

By the above-described heating, the organic adhesive layer 7 starts to be thermally decomposed and is softened, and accordingly, adhesion strength of the organic adhesive layer 7 is gradually reduced. Moreover, the self weight of the base member 3 is applied downward to a boundary portion 59 between the electrostatic chuck 5 and the base member 3, and accordingly, the base member 3 is separated from the electrostatic chuck 5 and falls down.

Note that, though the inert gas may be introduced into the hermetically sealed heating furnace 27 after a pressure therein is reduced once, the inert gas may be flown into the heating furnace 27 without hermetically sealing the heating furnace 27. It is more preferable to set an oxygen concentration in the heating furnace 27 at 100 ppm or less at the time of the heating. By setting the oxygen concentration at 100 ppm or less, oxidation of surfaces of the base member 3 and the electrostatic chuck 5 is eliminated, and moreover, a deterioration of the base member 3 and the electrostatic chuck 5 when both of them are separated from each other is eliminated.

Next, a description will be made of the case of attaching the weight pieces onto the base member 3 and using the total load of the base member 3 and the weight pieces.

Figure 5:
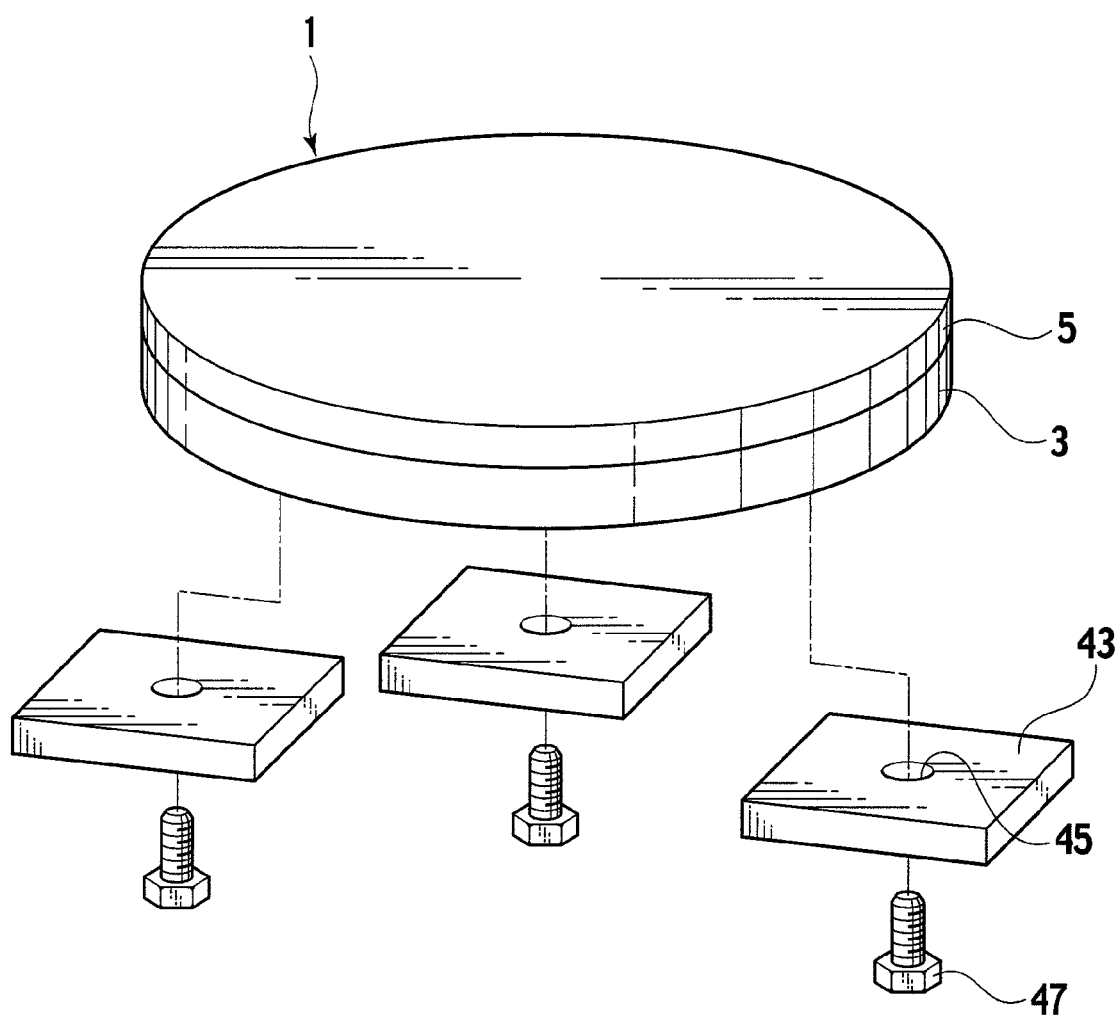
FIG. 5 is a perspective view showing a state of attaching weight pieces onto the substrate mounting member.
Figure 6:
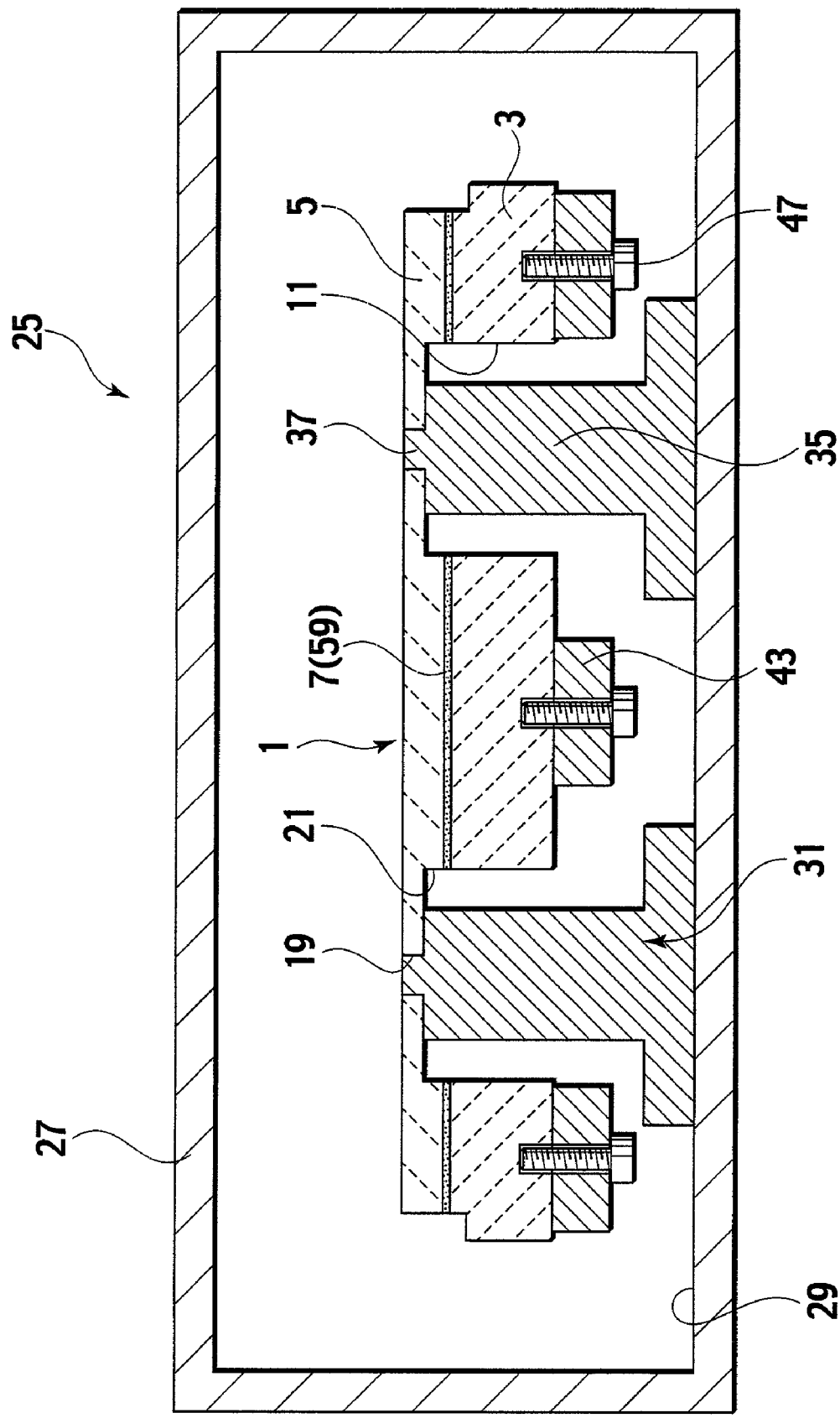
FIG. 6 is a cross-sectional view showing a state of disposing, in the heating apparatus, the substrate mounting member attached with the weight pieces and separating the base member therefrom.

As shown in FIG. 5, screw holes are formed on a lower surface of the base member 3, and insertion holes 45 which allow bolts 47 to penetrate therethrough are formed in weight pieces 43. As shown in FIG. 6, the weight pieces 43 are attached into the screw holes on the lower surface of the base member 3 by using the bolts 47.

Hence, while the inner temperature of the heating furnace 27 is keeping on being raised to the thermal decomposition temperature of the bonding material, the lift pin holes 19 of the electrostatic chuck 5 are fitted to the protruding portions 37 of the support bodies 31, and the electrostatic chuck 5 is thereby suspended on the support bodies 31. Then, the total load of the base member 3 and the weight pieces 43 is applied downward to the boundary portion 59 between the electrostatic chuck 5 and the base member 3. In such a way, the base member 3 can be separated from the electrostatic chuck 5 more efficiently than in the case of applying only the self weight of base member 3 to the boundary portion 59.

Note that the weight pieces 43 may be of any substance as long as it is not deformed or emits gas by being heated up; however, stainless steel, copper, and the like are preferable. Moreover, with regard to positions of the base member 3, onto which the weight pieces 43 are attached, it is preferable that the weight pieces 43 be attached onto equal-interval positions along the circumferential direction of the disc-like substrate mounting member 1. Moreover, when the weight pieces 43 are attached onto the base member 3 so that a position of the center of gravity of the substrate mounting member 1 onto which the weight pieces 43 are attached can be shifted from the center of the substrate mounting member 1 by a distance of ½ to ⅔ of a radius of the substrate mounting member 1, it becomes easier for the base member 3 to be peeled off from the electrostatic chuck 5, and this is preferable.

No matter which the organic adhesive layer 7 may be made of the thermoplastic resin or the thermosetting resin, it is preferable that the heating be performed at a temperature at which the base member 3 is not deformed (for example, 350° C. when the material of the base member 3 is aluminum) or less and at the thermal decomposition starting temperature or more. This is because, in this case, the organic adhesive layer 7 is not adhered onto the base member 3 and the electrostatic chuck 5.

Moreover, when the heating is performed in the inert gas, oxidation and the like of the resin of the organic adhesive layer 7 occur, and accordingly, the heating can be performed at a temperature higher than in the air. However, the heating temperature is set at the above-described thermal decomposition ending temperature or less. When the heating temperature is set at the thermal decomposition ending temperature or more, carbonization of the organic adhesive layer 7 advances, and the organic adhesive layer 7 which remains on the base member 3 and the electrostatic chuck 5 is strongly adhered onto the surface of the base member 3, resulting in that it takes a long time to remove the organic adhesive layer 7.

According to this method, when it becomes impossible for the organic adhesive layer 7 to hold the base member 3 and the weight pieces 43, exfoliation of the base member 3 from the organic adhesive layer 7 automatically occurs. Hence, no excessive load is applied to the base member 3 and the electrostatic chuck 5, and the base member 3 is not deformed, scratched, or so on, and accordingly, this is more preferable. Moreover, if a supply of the electric power to the heating furnace 27 is stopped by using a method for sensing the occurrence of the exfoliation when the exfoliation occurs, then the carbonization and the like of the organic adhesive layer 7 owing to the thermal decomposition can be prevented, and accordingly, this is preferable.

As the method for sensing the exfoliation, it is preferable to visually confirm the exfoliation through a window provided on the heating furnace 27. Moreover, a method for sensing an occurrence of conduction between the base member 3 and a plate member made of stainless steel can be employed, in which a lead wire is connected to the base member 3, the plate member is disposed at a position on which the base member 3 falls down, and a lead wire is connected to the plate member.

This sensing method by the conduction is preferable because the method concerned can easily give feedback to a control system of the heating furnace 27.

When the heating is started in a state where the pressure in the heating furnace 27 is set at 1 atm, and the temperature therein reaches the thermal decomposition starting temperature of the bonding material, the inert gas in the heating furnace 27 is sucked by a vacuum pump, thus making it possible to separate the base member 3 and the electrostatic chuck 5 from each other more effectively.

Next, a description will be made of the case of using the tool while mounting the substrate mounting member 1 on the upper surface of the hot plate 39 and heating up the substrate mounting member 1.

FIG. 3 is a conceptual cross-sectional view showing a separation device for use in this separation method. The hot plate 39 heated up by electricity is disposed on a floor surface. When the substrate mounting member 1 turned upside down is mounted on the hot plate 39, an upper surface (lower surface in FIG. 3) of the electrostatic chuck 5 abuts on the upper surface of the hot plate 39. Moreover, a tip end of a pulling jig 49 having a T shape when viewed from the side is screwed into the screw hole formed on the lower surface (upper surface in FIG. 3) of the base member 3.

Subsequently, the hot plate 39 is heated up to raise the temperature in the heating furnace 27 to the above-described heating temperature, and the heat is applied to the organic adhesive layer 7 through the electrostatic chuck 5. Then, the organic adhesive layer 7 causes the thermal decomposition, and adhesive force thereof is reduced. In this state, a grip portion 51 of the pulling jig 49 is lifted upward. Simultaneously, while incising the boundary portion 59 between the electrostatic chuck 5 and the base member 3 by inserting the minus screwdriver 53 thereinto, the electrostatic chuck 5 and the base member 3 are pried apart from each other so as to be peeled off from each other by utilizing the principle of leverage. In such a way, the base member 3 can be separated from the electrostatic chuck 5 surely and efficiently.

Here, a thermocouple 55 is inserted into a gas hole 57 of the base member 3 toward the vicinity of the organic adhesive layer 7, and the heating temperature is measure thereby. It is preferable that a heating time be 20 to 30 minutes.

Note that the heating temperature is set at the thermal decomposition temperature within a range from the thermal decomposition starting temperature to the thermal decomposition ending temperature. It is more preferable that the heating temperature be maintained at a temperature somewhat higher than the thermal decomposition starting temperature. When the heating is performed at the thermal decomposition ending temperature or more, there is an apprehension that the organic adhesive layer 7 is decomposed rapidly. Moreover, when the temperature of the organic adhesive layer 7 rapidly rises owing to the oxidation thereof, the decomposition of the organic adhesive layer 7 is further accelerated. As a result, the organic adhesive layer 7 carbonizes, and is strongly adhered onto the surface of the electrostatic chuck 5 or the base member 3 after both of them are separated from each other, and it takes a long time to remove the organic adhesive layer 7.

Moreover, after the base member 3 is separated from the electrostatic chuck 5, a part of the organic adhesive layer 7, which is adhered onto the electrostatic chuck 5 or the base member 3, is removed. As a method of this removal, a method for dissolving and removing the organic adhesive layer 7 by using an organic solvent or a method for scraping off the organic adhesive layer 7 by using a pallet and the like may be used. It is more effective to use both of the methods in combination.

Note that, as shown in FIG. 1, to the electrostatic chuck 5, the voltage applying terminal 13 which supplies the voltage thereto is bonded to the base member 3 through the insulating epoxy resin 17. Hence, when the electrostatic chuck 5 is to be peeled off from the base member 3 in a state where the organic adhesive layer 7 partially remains thereon without heating up the substrate mounting member 1, the voltage applying terminal 13 is detached from the electrostatic chuck 5 because bonding strength of the voltage applying terminal 13 to the electrostatic chuck 5 is low. However, according to the present invention, such a problem of detachment does not occur. Specifically, according to the present invention, the voltage applying terminal 13 remains to be attached onto the electrostatic chuck 5, and can be reused as it is.

Next, a description will be made of the case of, as shown in FIG. 4, providing the heat transfer member 41 on the upper surface of the hot plate 39, and using the tool while heating up the substrate mounting member 1 by the heat transfer member 41. However, with regard to portions similar to those in the case of separating the base member 3 and the electrostatic chuck 5 from each other by using the tool while directly mounting the substrate mounting member 1 on the upper surface of the above-described hot plate 39 and heating the substrate mounting member 1, a description thereof will be omitted.

As shown in FIG. 4, the heat transfer member 41 is provided on the upper surface of the hot plate 39. The heat transfer member 41 is made of aluminum nitride, and the upper surface thereof is formed smoothly.

When the hot plate 39 is heated up, and a temperature of the heat transfer member 41 reaches 300 to 350° C., the substrate mounting member 1 is turned upside down and mounted on the heat transfer member 41. The thermocouple 55 is inserted into the gas hole 57 of the base member 3 until reaching the vicinity of the organic adhesive layer 7, and a temperature of the electrostatic chuck 5 is measured thereby. At a point of time when the temperature of the electrostatic chuck 5 reaches the thermal decomposition starting temperature or more, the tool such as the minus screwdriver 53 is inserted into the boundary portion 59 between the base member 3 and the electrostatic chuck 5. Moreover, by utilizing the principle of leverage, the electrostatic chuck 5 and the base member 3 are separated from each other so as to be pried apart from each other by the tool. In this case, when the heat transfer member 41 and the electrostatic chuck 5 are heated up, if the entirety of the hot plate 39 is covered with a cap, then the heating time can be shortened.

Here, when a heating temperature of the hot plate 39 is set approximately at the thermal decomposition ending temperature of the organic adhesive layer 7 or less, the adhesion of the adhesive owing to the carbonization of the organic adhesive layer 7 can be avoided. Moreover, it is more preferable to set the heating temperature at which the electrostatic chuck 5 is separated from the base member 3 at a temperature higher than the thermal decomposition starting temperature by 50 to 70° C. because a working time can be shortened thereby. According to this method, it is not necessary to maintain the substrate mounting member at a certain fixed temperature, and cost of equipment in this case can be reduced to a large extent as compared with that of the heating furnace.

Note that other various methods than that of this embodiment can be employed as long as such other methods are methods for heating up the organic adhesive layer 7 to the thermal decomposition temperature which is the thermal decomposition starting temperature or more and the thermal decomposition ending temperature or less, and applying the separation load to the base member 3 and the electrostatic chuck 5 at the point of time when the organic adhesive layer 7 is thermally decomposed.

Second Embodiment

In the above-described first embodiment, the description has been made of the disassembly method for separating the base member 3 from the substrate mounting member 1. In a second embodiment, a description will be made of a method for reusing the separated electrostatic chuck 5 and base member 3.

In some case, the residue of the organic adhesive layer 7 is partially adhered onto the bonding surface of at least either the electrostatic chuck 5 or the base member 3, which as been separated from each other in the first embodiment. In this case, it is preferable to dissolve the residue by immersing the residue into the organic solvent, or to scrape off the residue by using the pallet and the like.

Subsequently, the separated base member 3 and electrostatic chuck 5 are bonded to each other by using the adhesive or the bonding sheet, thus making it possible to reuse the bonded base member 3 and electrostatic chuck 5 as a new substrate mounting member 1.

EXAMPLES

A description will be more specifically made below of the present invention through examples.

Example 1

As shown in FIG. 1, the substrate mounting member 1 for use in Example 1 is a member formed by bonding the base member 3 made of aluminum and the electrostatic chuck 5 made of aluminum nitride to each other through the organic adhesive layer 7. Three lift pin holes 19 were drilled in the electrostatic chuck 5 along the circumferential direction thereof, and the spot facing portions 21 were formed on the lower portions of the lift pin holes 19. A weight of the base member 3 was 3400 g. Moreover, with regard to the type of the organic adhesive layer 7, as shown in Table 1, thermosetting acrylic resin, thermosetting silicon resin, thermosetting polyimide resin, thermosetting epoxy resin, thermosetting acrylic resin, and thermoplastic acrylic resin were used. The thermal decomposition starting temperatures and thermal decomposition ending temperatures of the organic adhesive layers 7 made of these resins were measured. Results of the measurements were obtained as shown in Table 1.

(Table 1)

TABLE 1

| | TYPE OF ADHESIVE LAYER | THERMAL DECOMPOSITION STARTING TEMPERATURE | THERMAL DECOMPOSITION ENDING TEMPERATURE | HEATING TEMPERATURE | HEATING TIME | AFTER HEATING | FLATNESS | VARIATION OF SUCTION FORCE |
|---|---|---|---|---|---|---|---|---|
| PRESENT INVENTION EXAMPLE 1 | THERMOSETTING ACRYLIC RESIN | 190° C. | 320° C. | 300° C. | 10 min | SEPARATED | 20 μm | 1 Torr |
| PRESENT INVENTION EXAMPLE 2 | THERMOSETTING SILICON RESIN | 230° C. | 360° C. | 300° C. | 10 min | SEPARATED | 21 μm | 1 Torr |
| PRESENT INVENTION EXAMPLE 3 | THERMOSETTING POLYIMIDE RESIN | 280° C. | 430° C. | 300° C. | 10 min | SEPARATED | 19 μm | 1 Torr |
| RESENT INVENTION EXAMPLE 4 | THERMOSETTING EPOXY RESIN | 200° C. | 340° C. | 300° C. | 10 min | SEPARATED | 22 μm | 1 Torr |
| PRESENT INVENTION EXAMPLE 5 | THERMOPLASTIC ACRYLIC RESIN | 190° C. | 320° C. | 300° C. | 10 min | SEPARATED | 21 μm | 1 Torr |

Subsequently, as shown in FIG. 2, the substrate mounting member 1 was put in the heating furnace 27, the lift pin holes 19 of the electrostatic chuck 5 were fitted to the protruding portions 37 on the upper ends of the support bodies 31, and the substrate mounting member 1 was suspended on the support bodies 31. In such a way, the self weight of the base member 3 is applied downward to the boundary portion 59 between the electrostatic chuck 5 and the base member 3. Note that an internal capacity of the heating furnace 27 was 20 liters. Moreover, the height H of the support bodies 31 was set larger by 3 mm than the total dimension S of the thickness of the base member 3 and the depth of the spot facing portions 21 of the electrostatic chuck 5.

Moreover, nitrogen gas was flown into the heating furnace 27 at a flow rate of 1000 sccm, and the nitrogen gas was thereby substituted for the air in the heating furnace 27. In such a way, the nitrogen gas was mixed with the air in the heating furnace 27, the oxygen concentration was gradually reduced in the inside of the heating furnace 27, and the air was discharged to the outside of the furnace. In approximately 30 minutes, the oxygen concentration fell below 100 ppm, and accordingly, the flow rate of the nitrogen gas was reduced to 100 sccm.

Subsequently, a heater (not shown) of the heating furnace 27 was energized, and the temperature in the furnace was raised to a heating temperature shown in Table 1 at a temperature rise rate of 10° C./min. The temperature in the heating furnace was maintained at the heating temperature thus set for a predetermined time, and thereafter, the energization to the heater was stopped, and the heating furnace 27 was naturally cooled down.

Note that, during the heating and the natural cool down, the nitrogen gas continued to be flown at a flow rate of 100 sccm, and it was confirmed by an oxygen concentration meter that the oxygen concentration was 100 ppm or less.

When a door of the heating furnace 27 was opened at a point of time when the temperature in the furnace reached less than 60° C. as a result of the natural cool down of the heating furnace 27, it was observed that the electrostatic chuck 5 and the base member 3 were separated from each other. However, a part of the organic adhesive layer 7 remained, and such a part which has remained was somewhat discolored.

The separated electrostatic chuck 5 and base member 3 were immersed into acetone for 30 minutes, and thereafter, the bonding surface of the electrostatic chuck 5 or the base member 3 was scrubbed by a Nylon scrubber, and the organic adhesive layer 7 which had remained thereon was removed.

Thereafter, flatness on the bonding surface of the electrostatic chuck 5 or the base member 3 was measured by using a three-dimensional measuring instrument in each example differentiated from others in the type of the organic adhesive layer, and results shown in Table 1 were obtained. Note that the flatness of the base member 3 in a new state was less than 50 μm in any of the examples, and it was found out that the flatness of the electrostatic chuck 5 or the base member 3 was not deteriorated owing to the heating separation.

Moreover, suction force of the electrostatic chuck 5 was measured. A direct-current voltage of 350V was applied to the electrode portion of the electrostatic chuck 5, suction force generated at this time was measured on five spots of the electrostatic chuck 5 by silicon probes with a diameter of 1 inch, and an average value of measurement values thus obtained was calculated. Such suction forces calculated in the respective examples were compared with suction forces (20 to 30 Torr) before the heat separation, and as shown in Table 1, differences therebetween were confirmed. If such a difference between before and after the treatment of the heating separation is less than 2 Torr, then it can be determined that a substantial variation does not occur therebetween in terms of measurement accuracy. In this Example, the difference in suction force was less than ±1 Torr, and it was determined that the suction force of the electrostatic chuck was not varied between before and after the heating.

Note that, in this Example, the epoxy resin 17 was filled in the gap between the attachment hole 15 of the base member 3 for the voltage applying terminal 13 and the voltage applying terminal 13 for the purpose of insulating the base member 3 and the voltage applying terminal 13 from each other. A half of the epoxy resin 17 was lost in a latter half of the heat treatment step, and without damaging the voltage applying terminal 13, the epoxy resin was also separated therefrom. Hence, electrostatic force was normally generated in the electrostatic chuck 5 even after the direct-current voltage was directly applied to the voltage applying terminal 13.

Next, the separated electrostatic chuck 5 and base member 3 were bonded to each other by the thermosetting acrylic resin, and the substrate mounting member 1 was thereby created. A wafer was sucked on the substrate mounting member 1, and was heated up by a lamp of 1500 W, and a temperature distribution of the wafer was measured. As a result, the wafer exhibited a temperature distribution as if the substrate mounting member had been as good as new.

As described above, the following was confirmed. Even if the organic adhesive layer 7 is deteriorated as a result that the substrate mounting member 1 is used for a long period of time, the electrostatic chuck 5 and the base member 3 are separated from each other, and then are newly bonded to each other after removing the organic adhesive layer 7, and the temperature distribution of the electrostatic chuck 5 is thereby restored. This represents that the base member 3 and the electrostatic chuck 5 can be reused by the method according to the present invention without causing any characteristic deterioration.

Example 2

Next, a description will be made of Example 2 where the base member 3 is separated from the substrate mounting member 1 by using the weight pieces 43.

For the substrate mounting member 1, a similar one to that of Example 1 described above was used. The weight pieces 43 (total weight: 3300 g) made of flat iron pieces, which are as shown in FIGS. 5 and 6, were attached onto the screw holes of the base member 3, and separation similar to that of Example 1 was performed. Results of the separation are shown in Table 2.

(Table 2)

TABLE 2

| | TYPE OF ADHESIVE LAYER | TOTAL WEIGHT OF WEIGHT PIECES | WEIGHT DISTRIBUTION OF WEIGHT PIECES | HEATING TEMPERATURE | HEATING TIME | AFTER HEATING | FLATNESS | VARIATION OF SUCTION |
|---|---|---|---|---|---|---|---|---|
| PRESENT INVENTION EXAMPLE 6 | THERMOSETTING ACRYLIC RESIN | 3300 g | 11:11:11 | 300° C. | 8 min | SEPARATED | 30 μm | 1 Torr |
| PRESENT INVENTION EXAMPLE 7 | THERMOSETTING ACRYLIC RESIN | 3300 g | 10:10:13 | 300° C. | 5 min | SEPARATED | 28 μm | 1 Torr |

According to this Example, the base member 3 was able to be separated from the electrostatic chuck 5 in a shorter time than in Example 1. Here, as shown in Present invention example 7, the weights of the three weight pieces 43 were distributed in a ratio of 10:10:13, and the center of gravity of the substrate mounting member 1 was shifted from the diametrical center of the substrate mounting member 1 by the weight pieces 43. Then, the base member 3 was able to be separated from the electrostatic chuck 5 in a shorter time than in Example 1.

Moreover, the separated electrostatic chuck 5 and base member 3 were bonded to each other by the thermosetting acrylic resin one more time, and the temperature distribution of the wafer was measured under the same conditions as in Example 1. Then, the wafer exhibited a temperature distribution as if the wafer had been as good as new.

Example 3

Next, in Example 3, the base member 3 was separated from the electrostatic chuck 5 while exhausting the atmosphere in the heating furnace 27.

First, after the air in the heating furnace 27 was exhausted, the nitrogen gas was introduced thereinto, and the pressure in the heating furnace 27 was set at 1 atm. Thereafter, in 10 minutes after the atmospheric temperature in the heating furnace 27 was raised to the heating temperature, the exhaust was started from the pressure of 1 atm. The exhaust was performed by a rotary pump, and the pressure in the furnace during the exhaust was approximately 4 Torr. As a result, as shown in Table 3, the base member 3 was separated from the electrostatic chuck 5 in 3 minutes after the start of the exhaust, and the base member 3 was able to be separated in a shorter time as compared with the case where the exhaust was not performed.

(Table 3)

TABLE 3

| | TYPE OF ADHESIVE LAYER | THERMAL DECOM-POSITION STARTING TEMPERATURE | THERMAL DECOM-POSITION ENDING TEMPERATURE | HEATING TEMPERA-TURE | HEATING TIME | AFTER HEATING | FLAT-NESS | VARIATION OF SUCTION FORCE |
|---|---|---|---|---|---|---|---|---|
| PRESENT INVENTION EXAMPLE 8 | THERMOSETTING ACRYLIC RESIN | 190° C. | 320° C. | 300° C. | 3 min | SEPARATED | 33 μm | 1 Torr |

In a similar way, the separated electrostatic chuck 5 and base member 3 were bonded to each other by the thermosetting acrylic resin, and the temperature distribution of the substrate mounting member 1 was measured under the same conditions as in Examples 1 and 2. Then, the substrate mounting member 1 exhibited a temperature distribution as if it had been as good as new.

Example 4

Subsequently, a description will be made of Example where the electrostatic chuck 5 and the base member 3 were separated from each other by using the tool. Here, the adhesive layer 7 was made of the thermoplastic acrylic resin, the thermal decomposition starting temperature was 190° C., and the thermal decomposition ending temperature was 320° C.

As shown in FIG. 4, the heat transfer member 41 made of aluminum nitride was provided on the hot plate 39, and the temperature of the heat transfer member 41 was raised to 300 to 350° C. by heating up the hot plate 39. Moreover, the substrate mounting member 1 was turned upside down to dispose the electrostatic chuck 5 on the lower side, the electrostatic chuck 5 was made to abut on the heat transfer member 41, and the heating was performed therefor for 10 minutes. Here, the temperature of the substrate mounting member 1 was measured by inserting the thermocouple 55 into the gas hole 57 of the base member 3. When the temperature measured by the thermocouple 55 reached 250° C. as the thermal decomposition starting temperature or more, a knife was inserted between the electrostatic chuck 5 and the base member 3 from side end portions of the bonding surfaces of the electrostatic chuck 5 and the base member 3 along the organic adhesive layer 7, and the organic adhesive layer 7 was thereby incised.

Subsequently, as shown in FIG. 4, the thin minus screwdriver 53 was inserted into the boundary portion 59 between the base member 3 and the electrostatic chuck 5 to lightly pry the base member 3 and the electrostatic chuck 5 from each other while lifting up the pulling jig 49 attached onto the base member 3, the base member 3 was separated from the electrostatic chuck 5.

Subsequently, the residue of the organic adhesive layer 7 still in a hot state, which was adhered onto the base member 3 and the electrostatic chuck 5, was scraped off by using a stainless steel pallet. Finally, the organic adhesive layer 7 was dissolved by using acetone, and the residue was removed by washing using ion exchange water. As a result of measuring the flatness of the obtained electrostatic chuck 5, no variation occurred from the time when the electrostatic chuck 5 was new.

The direct-current voltage of 350V was applied to the electrode portion of the electrostatic chuck 5 obtained by the above-described separation, and the suction force generated at this time was measured by the silicon probes with a diameter of 1 inch. The suction forces were measured on five spots, an average value thereof was taken and compared with the suction force (20 to 30 Torr) before the heat separation, and a difference therebetween was confirmed. If the difference between before and after the treatment of the heating separation is less than 2 Torr, then it can be determined that no variation occurs therebetween in terms of measurement accuracy. In this case, the difference in suction force was ±1 Torr or less, and it was found out that the electrostatic chuck 5 maintained suction force as if the electrostatic chuck 5 had been as good as new.

What is claimed is:

1. A disassembly method for a substrate mounting member that includes an electrostatic chuck bonded to a base member through an organic adhesive layer, said method comprising:
    inserting one or more support bodies through housing holes formed through the base member to contact spot facing portions on a rear face of the electrostatic chuck to suspend the substrate mounting member above a surface, wherein the one or more support bodies support the weight of the substrate mounting member without contacting the base member;
    heating up, to a thermal decomposition temperature of the organic adhesive layer, the substrate mounting member to soften and decompose the organic adhesive layer; and
    applying a separation load to the electrostatic chuck and the base member in a direction of pulling the electrostatic chuck and the base member apart from each other, thereby separating the electrostatic chuck and the base member from each other,
    wherein the thermal decomposition temperature is a temperature within a range from a thermal decomposition starting temperature to thermal decomposition ending temperature of the organic adhesive layer, and wherein the separation load is a self weight of the base member that is generated when the substrate mounting member is suspended from the one or more support bodies.

2. The disassembly method of a substrate mounting member according to claim 1, wherein the thermal decomposition starting temperature and thermal decomposition ending temperature of the organic adhesive layer are measured, and the thermal decomposition temperature is set based on values obtained by the measurement.

3. The disassembly method of a substrate mounting member according to claim 1, wherein the separation load is a total load of the base member and a weight piece, the total load being generated when the weight piece is attached onto the electrostatic chuck, and the electrostatic chuck is suspended.

4. The disassembly method of a substrate mounting member according to claim 1, wherein the electrostatic chuck and the base member are separated from each other in an atmosphere of inert gas.

5. A reuse method of a substrate mounting member, wherein the electrostatic chuck and the base member are separated from each other by using the disassembly method according to claim 1, and then at least either the separated electrostatic chuck or the separated base member is reused.

* * * * *